United States Patent
Chuang

(10) Patent No.: US 7,998,789 B1
(45) Date of Patent: Aug. 16, 2011

(54) METHOD AND SYSTEM FOR FORMING COPPER INDIUM GALLIUM SULFUR SELENIDE ABSORPTION LAYER AND CADMIUM SULFIDE BUFFER LAYER UNDER NON-VACUUM CONDITION

(75) Inventor: Chuan-Lung Chuang, Taoyuan (TW)

(73) Assignee: Jenn Feng New Energy Co., Ltd., Taoyuan (TW)

( * ) Notice: Subject to any disclaimer, the term of this patent is extended or adjusted under 35 U.S.C. 154(b) by 0 days.

(21) Appl. No.: 12/761,513

(22) Filed: Apr. 16, 2010

(51) Int. Cl.
 *H01L 21/00* (2006.01)
 *H01L 21/16* (2006.01)
 *H01G 9/20* (2006.01)

(52) U.S. Cl. ............ 438/104; 438/57; 438/61; 438/94; 438/497; 438/795; 257/E21.001; 257/E21.324; 257/E21.464

(58) Field of Classification Search ........... 257/E21.001, 257/E21.324, E21.464
See application file for complete search history.

(56) References Cited

U.S. PATENT DOCUMENTS

| | | | | |
|---|---|---|---|---|
| 2008/0274577 A1* | 11/2008 | Ennaoui et al. | ................ | 438/57 |
| 2009/0130796 A1* | 5/2009 | Taunier et al. | ................ | 438/94 |

* cited by examiner

*Primary Examiner* — Mohsen Ahmadi
(74) *Attorney, Agent, or Firm* — Rabin & Berdo, P.C.

(57) ABSTRACT

A method and a system for forming a copper indium gallium sulfur selenide (CIGSSe) absorption layer and a cadmium sulfide (CdS) buffer layer under non-vacuum condition is disclosed. A coating layer is formed on the back electrode layer on the substrate by mixing the slurry on the back electrode layer, and the coating layer formed on the back electrode layer is densified by a densification device after initially dried, and then a primary selenization/sulfurization reaction process is carried out to form a primary CIGSSe layer, and then a thermal process is carried out to improve the lattice match of the primary CIGSSe layer, and then an impurity cleaning process is carried out by using potassium cyanide or bromide to remove the impurities of cuprous selenide and copper sulfide, and then a rear-stage selenization/sulfurization reaction process is carried out to produce the required rear-stage CIGSSe absorption layer. Finally, a CdS buffer layer is formed on the CIGSSe absorption layer by a chemical bath deposition method.

9 Claims, 3 Drawing Sheets

METHOD AND SYSTEM FOR FORMING COPPER INDIUM GALLIUM SULFUR SELENIDE ABSORPTION LAYER AND CADMIUM SULFIDE BUFFER LAYER UNDER NON-VACUUM CONDITION

BACKGROUND OF THE INVENTION

1. Field of the Invention

The present invention relates to a method and a system for forming a copper indium gallium sulfur selenide absorption layer and a cadmium sulfide buffer layer, and more specifically to a method and a system which carry out a two-step selenization/sulfurization reaction under non-vacuum condition to form an absorption layer of good quality.

2. The Prior Arts

Due to a rising global trend in green energy, the copper indium gallium diselenide (CIGS) solar cell, which is a complex quaternary alloy, has been studied and developed as a potential energy source in industry. The CIGS solar cell is not restricted by the raw materials, and can be manufactured on a large-area flexible substrate. The conversion efficiency per unit solar cell is up to 20%, and the conversion efficiency of a solar cell module is also up to 14%.

Referring to FIG. 1, a conventional CIGS solar cell is illustrated. As shown in FIG. 1, a CIGS solar cell includes a substrate 10, a back electrode layer 20, an absorption layer 30, a buffer layer 40, a transparent conductive layer 50, and a front electrode layer 60 sequentially stacked from bottom to top. The incident light L enters the CIGS solar cell from the top.

The substrate 10 is generally made of glass. Molybdenum is used for making the back electrode layer 20. The absorption layer 30 consists of a quaternary compound including the elements of copper, indium, gallium and selenium, and the absorption layer 30 is an N type semiconductor layer. The buffer layer 40 includes zinc sulfide, which is a P type semiconductor layer. The transparent conductive layer 50 includes indium tin oxide (ITO) or zinc oxide (ZnO). The front electrode layer 60 may be made of nickel and aluminum, and it is usually formed as a mesh-like pattern. First, a nickel layer is formed on the transparent conductive layer 50 to avoid forming metal oxides having high resistance, and then an aluminum layer is formed thereon.

There is a p-n junction 35 between the N type absorption layer 30 and the P type buffer layer 40 for absorbing the incident light to generate the free electron-hole pairs. Moreover, the back electrode layer 20 has a positive voltage and the front electrode layer 60 has a negative voltage. The back electrode layer 20 and the front electrode layer 60 connect to an outside load through the positive contact 22 and the negative contact 62, respectively, for outputting electric power.

Conventionally, the processes for fabricating CIGS solar cell can be generally divided into the vacuum processes and the non-vacuum processes. In the vacuum processes, the evaporation method and sputtering method are mainly used. However, in the vacuum processes, the expensive process equipments are required, the material utilization efficiency is low, and the fabricating cost is high. In the non-vacuum processes, the ink method is generally used and by which the manufacturing cost can be reduced, and thereby the non-vacuum processes have great development potential. However, the compactness of the formed CIGS absorption layer is relatively low so that the quaternary compound with the large particle size is not easily formed. As a result, many grain boundaries exist in the absorption layer, and when the light falls onto these grain boundaries, it may not be successfully converted into electric energy so that the photovoltaic conversion efficiency becomes low.

Therefore, it is needed a method and a system which may improve the absorption efficiency and the photoelectric conversion efficiency of the CIGS absorption layer under non-vacuum condition, and provide a good lattice match of cadmium sulfide (CdS) buffer layer with CIGS absorption layer to form a better p-n junction, so as to further solve the above problem of the prior art.

SUMMARY OF THE INVENTION

The main objective of the present invention is to provide a method for forming a copper indium gallium sulfur selenide (CIGSSe) absorption layer and a cadmium sulfide (CdS) buffer layer under non-vacuum condition. In the method of present invention, a coating layer is formed on a back electrode layer on the substrate by mixing slurry and coating it on the back electrode layer. After the substrate is dried, the densification process is carried out using a densification device. Then, a primary sulfurization process and a primary selenization process are carried out to form a primary CIGSSe layer. After that, a thermal process is performed to improve the lattice match of the primary CIGSSe layer. An impurity cleaning process is then performed by using potassium cyanide or bromide to remove impurities of cuprous selenide and copper sulfide. Then, a rear-stage sulfurization process and a rear-stage selenization process are carried out to generate the required CIGSSe absorption layer. Finally, a CdS buffer layer is formed on the CIGSSe layer by a chemical bath deposition. The CIGSSe absorption layer and the CdS buffer layer can be applied to a CIGS solar cell. The absorption efficiency and the photoelectric conversion efficiency of the absorption layer can be increased, and the lattice match of the buffer layer with the absorption layer can be improved. Furthermore, the p-n junction with high efficiency is formed between the absorption layer and the buffer layer so that the manufacturing cost can be reduced and the performance of the overall CIGS solar cell can be improved.

Another objective of the present invention is to provide a system of forming a copper indium gallium sulfur selenide (CIGSSe) absorption layer and a cadmium sulfide (CdS) buffer layer under non-vacuum condition, and this system includes a mixing device, a coating layer forming device, a drying device, a densification device, a primary selenization/sulfurization device, a thermal process device, an impurity cleaning device, a rear-stage selenization/sulfurization device, and a CdS buffer layer growth device. Therefore, by using the above-mentioned devices, a mixing process, a coating layer forming process, a drying process, a densification process, a primary selenization/sulfurization reaction process, a thermal process, an impurity cleaning process, a rear-stage selenization/sulfurization process, and a CdS buffer layer growth process can be performed, respectively. Therefore, a CIGSSe absorption layer and a CdS buffer layer are sequentially formed on the molybdenum layer. A high-performance CIGS solar cell can hence be manufactured.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Reference will now be made in detail to embodiments of the present invention, examples of which are illustrated in the accompanying drawings.

Figure 1:
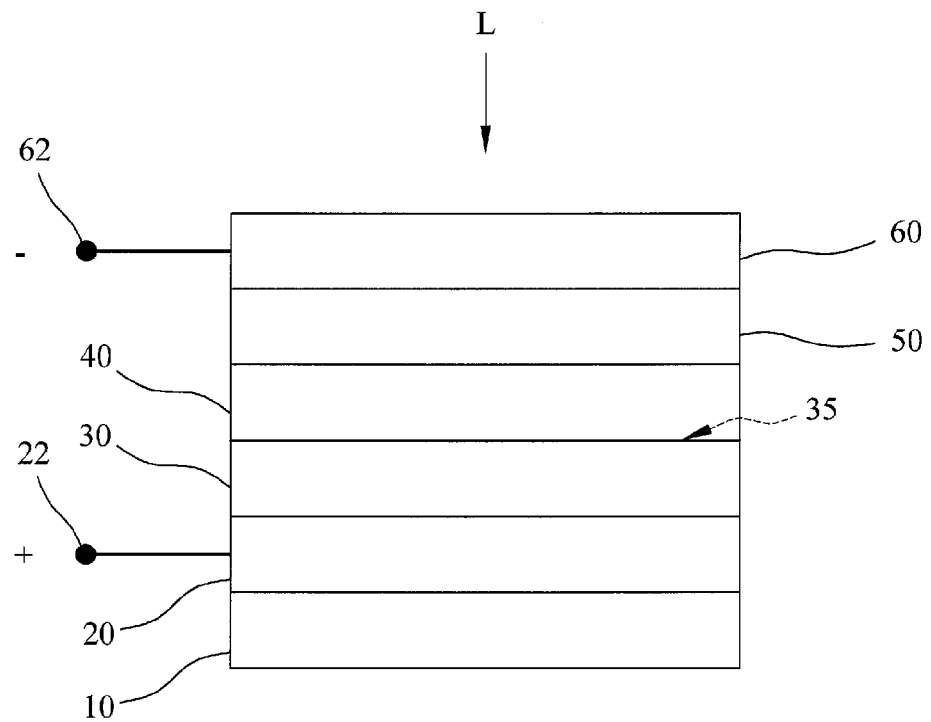
FIG. 1 shows a schematic diagram of a conventional CIGS solar cell.
Figure 2:
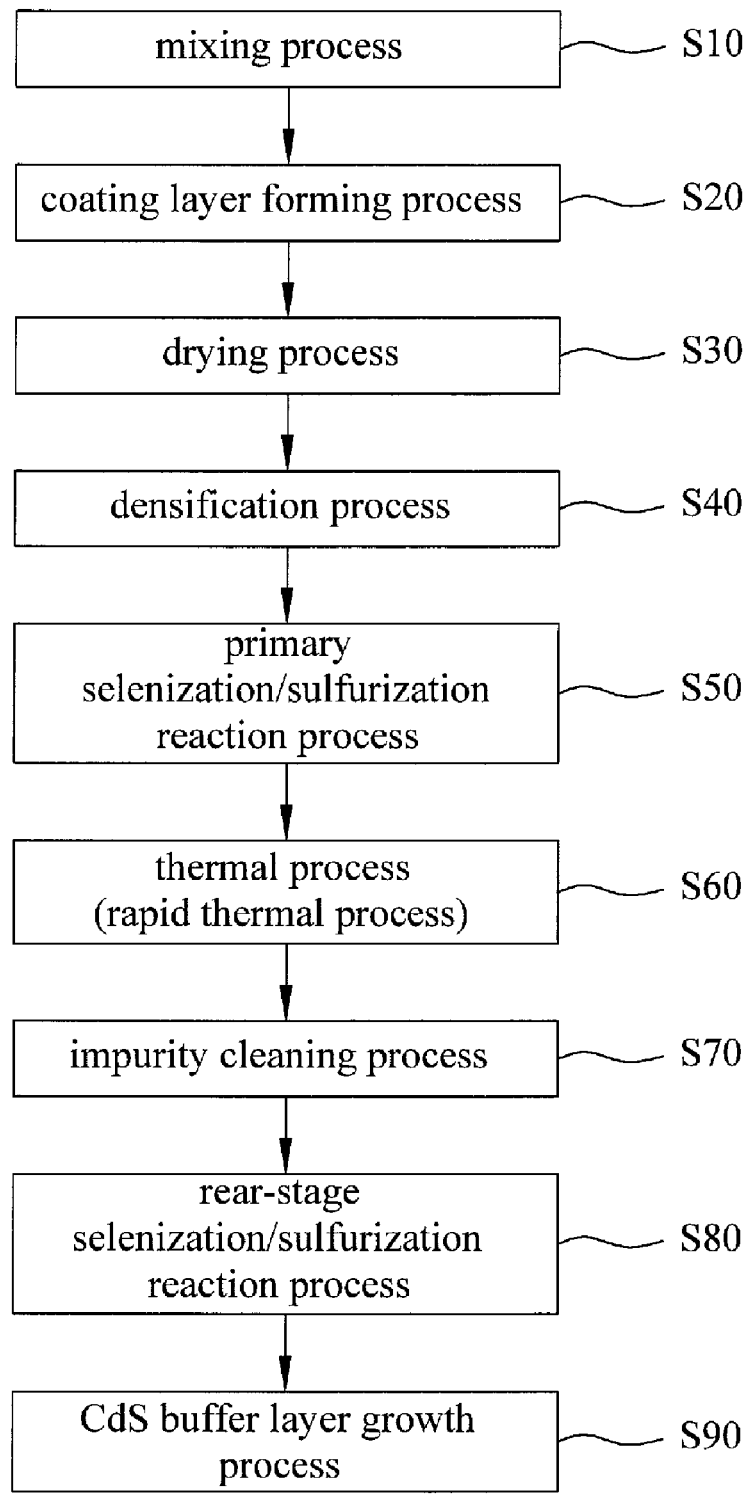
FIG. 2 depicts a flowchart of the method according to the present invention.

Referring to FIG. 2, a flow chart of the method according to the present invention is illustrated. As shown in FIG. 2, the method of the present invention starts at S10. A mixing process is performed under non-vacuum condition. In a mixing process, the copper-indium-gallium-sulfur-selenium powder, the solvent, and the additive are mixed to form a CIGSSe slurry. The copper-indium-gallium-sulfur-selenium powder may include at least one of powders of copper-indium (CuIn) alloy, copper-indium-gallium (CuInGa) compound, copper-indium selenide (CuInSe), copper-indium-gallium selenide (CuInGaSe), copper-indium sulfide (CuInS), and copper-indium-gallium sulfide (CuInGaS). The solvent may include at least one of alcohols and amines. The additive may include at least one of dispersant, adhesive, and leveling agent.

Then upon entering step 20, a coating layer forming process is performed. A CIGSSe slurry coating layer is formed on the back electrode layer 20 using the CIGSSe slurry. The coating layer forming process includes one of a spray process, a coating process, and an immersing process. The back electrode layer 20 is located on the upper surface of the substrate 10. Then upon entering step 30, a drying process is performed. Heating is applied for pre-drying and removing the solvent in the CIGSSe slurry coating layer.

Then upon entering step 40, a densification process is carried out to the CIGSSe slurry coating layer after removing the solvent. The densification process may include one of a rolling process, a high-pressure liquid spray pressing process, and a high-pressure gas spray pressing process. The CIGSSe slurry coating layer is densified by applying a pressure onto the CIGSSe slurry layer. Then upon entering step 50, a primary selenization/sulfurization reaction process is carried out. A sulfurization reaction and a selenization reaction are carried out by introducing hydrogen sulfide and hydrogen selenide, respectively, and the selenization and sulfurization of the CIGSSe slurry coating layer is carried out by elevating temperature to form a primary CIGSSe absorption layer.

Then upon entering step 60, a thermal process is performed for carrying out a crystallizing process for the primary CIGSSe absorption layer. The thermal process may be a rapid thermal process (RTP), which includes a rapid thermal crystallization process, a multi-stage crystallization process at a constant temperature, and a multi-stage cooling process so as to improve the crystal structure of the primary CIGSSe absorption layer. Then upon entering step 70, an impurity cleaning process is carried out. It may include removing impurity compounds, including at least one of cuprous selenide ($Cu_2Se$) and copper sulfide (CuS) in the primary CIGSSe absorption layer. The impurity scavenger includes at least one of sodium cyanide (NaCN), potassium cyanide (KCN), and bromide. Then, the cleaning and drying are performed. Then upon entering step 80, a rear-stage selenization/sulfurization reaction process is carried out. It is similar to the primary selenization/sulfurization reaction process of Step 5, which includes a sulfurization reaction and a selenization. reaction It allows the primary CIGSSe absorption layer to further form a rear-stage CIGSSe absorption layer, which is the required CIGSSe absorption layer, through the sulfurization and the selenization reactions.

Finally, upon entering step 90, a CdS buffer layer growth process, a substrate scraping process, and a cleaning drying process are carried out. In the CdS buffer layer growth process, CIGSSe absorption layer produced from Step 80 is immersed in an aqueous solution comprising sulfur (S) and cadmium (Cd), and then a CdS buffer layer is formed on the CIGSSe absorption layer by a chemical bath deposition method. The aqueous solution includes chloride, ammonia ($NH_3$), and thiourea ($SC(NH_2)_2$), and the chloride may include at least one of cadmium chloride ($CdCl_2$), cadmium sulfate ($CdSO_4$), cadmium iodide ($CdI_2$), and cadmium diacetate ($Cd(CH_3COO)_2$). In the substrate scraping process, the edges and the back of the substrate are scraped to remove the redundant materials.

The feature of the method according to the present invention is that a two-step selenization/sulfurization reaction under non-vacuum condition is carried out, to improve the quality of the CIGSSe absorption layer. The selenization/sulfurization reaction sequentially includes a sulfurization and a selenization. Furthermore, before the first stage of the primary sulfur-selenium reaction, a densification process is carried out to the dried CIGSSe slurry coating layer. As a result, the amount of the grain boundaries can be reduced, and the photoelectric conversion efficiency can be improved.

Another feature of the method according to the present invention is that a rapid thermal process and an impurity cleaning process are sequentially performed between the first stage of the primary selenization/sulfurization reaction process and the second stage of the rear-stage selenization/sulfurization reaction process. The rapid thermal process is employed for improving the crystal structure of the primary CIGSSe absorption layer produced from the primary selenization/sulfurization reaction process so that the internal stresses are mitigated or eliminated, and the lattice match can be improved. The impurity cleaning process is employed for removing the impurities of cuprous selenide and copper sulfide, which may hinder the photoelectric conversion efficiency of the CIGSSe absorption layer. Therefore, the photoelectric conversion efficiency can be further improved.

Figure 3:
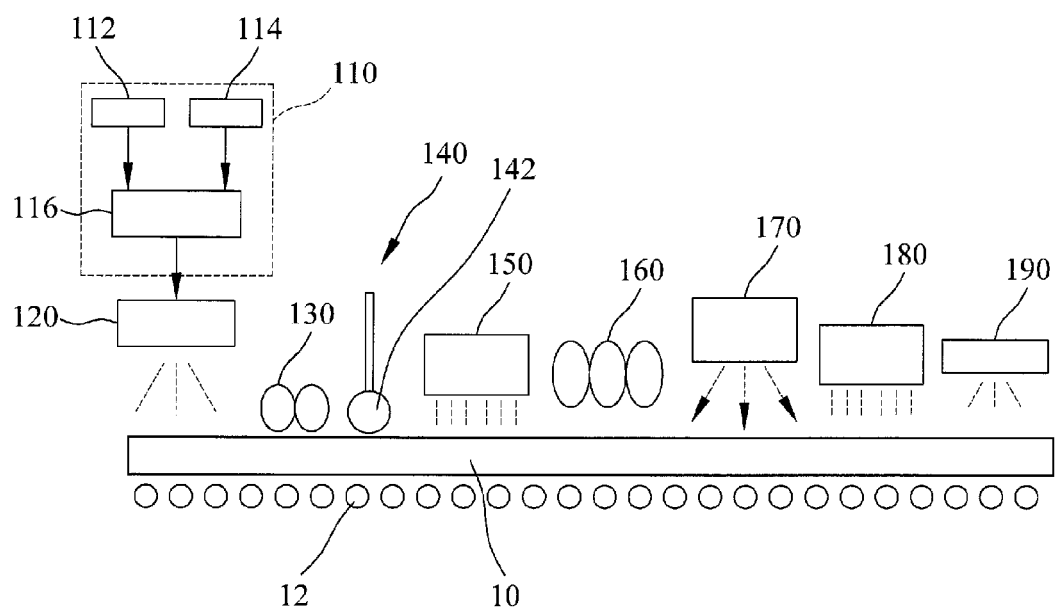
FIG. 3 shows a schematic diagram illustrating the system according to the present invention.

Referring to FIG. 3, a schematic diagram of the system according to the present invention is illustrated. As shown in FIG. 3, the system of the present invention includes a mixing device 110, a coating layer forming device 120, a drying device 130, a densification device 140, a primary sulfur-selenium reaction device 150, a thermal process device 160, an impurity cleaning device 170, a rear-stage selenization/sulfurization reaction device 180, and a CdS buffer layer growth device 190. Therefore, a mixing process, a coating layer forming process, a drying process, a densification process, a primary selenization/sulfurization reaction process, a thermal process, an impurity cleaning process, a rear-stage selenization/sulfurization reaction process, and a CdS buffer layer growth process are performed, respectively. As a result, a CIGSSe absorption layer and a CdS buffer layer are sequentially formed on the molybdenum layer.

The mixing device 110 may include at least one powder tank 112, at least one solvent tank 114, and a mixing tank 116. The at least one powder tank 112 is used for containing a plurality of powders including at least one of copper-indium (CuIn) alloy, copper-indium-gallium (CuInGa) compound, copper-indium selenide (CuInSe), copper-indium-gallium selenide (CuInGaSe), copper-indium sulfide (CuInS), and copper-indium-gallium sulfide (CuInGaS). The at least one solvent tank 114 is used for containing a solvent and an additive. The solvent includes at least one of alcohol and amine. The additive may include at least one of dispersant, adhesive, and leveling agent. In the mixing tank 116, the powders in the at least one powder tank 112 and the solvent and additive in the at least one solvent tank 114 are mixed by using an agitation device (not shown) to produce a CIGSSe slurry The coating layer forming device 120 may be one of a spray device used for carrying out a spray coating process, a coating device used for carrying out a coating process, and an immersion device used for an immersing process. The spray device may include an ultrasonic nozzle, an ultrasonic controller, and an air pressure flow controller (not shown). The CIGSSe slurry of the mixing tank 116 can be uniformly sprayed on the back electrode layer of the upper surface of the substrate 10 to form a CIGSSe slurry coating layer. The lower surface of the substrate 10 is supported and driven forward by a plurality of rollers 12.

Furthermore, the coating device may include a slurry extruder and a scraper. The slurry extruder extrudes the CIGSSe slurry onto the back electrode layer. The scraper is used for removing the redundant CIGSSe slurry to reach a required thickness. The immersion device includes an immersion tank and a scraper. The immersion tank contains the CIGSSe slurry. After the back electrode layer is immersed in the CIGSSe slurry, the redundant CIGSSe slurry is removed with a scraper to reach a required thickness.

The drying device 130 includes at least one of heating filaments, high frequency radiation source, and infrared ray source (not shown), and is used for pre-drying and removing the solvent in the CIGSSe slurry coating layer.

The densification device 140 may include one of a rolling device used for carrying out a rolling process, a high-pressure liquid spray pressing device used for carrying out a high-pressure liquid spray pressing process, and a high-pressure gas spray pressing device used for carrying out a high-pressure gas spray pressing process. In FIG. 3, a rolling device is taken as an example, and the densification device 140 includes at least one roller 142 for densifying the CIGSSe slurry coating layer.

Moreover, the high-pressure liquid spray pressing device may include a liquid compressor and a nozzle. The liquid compressor is used for raising the pressure of the spraying liquid and then jetting the spraying liquid onto the CIGSSe slurry coating layer through the nozzle, and thereby a pressure is applied to the CIGSSe slurry coating layer. The spraying liquid may be water. The high-pressure gas spray pressing device may include a gas compressor and a nozzle. The gas compressor raises a pressure of the gas, and then jets the gas onto the CIGSSe slurry coating layer through the nozzle, and thereby a pressure is applied to the CIGSSe slurry coating layer. The gas may be one of air, nitrogen, and argon.

The primary selenization/sulfurization reaction device 150 may include a primary sulfurization device and a primary selenization device (not shown) for introducing hydrogen sulfide and hydrogen selenide, respectively and allowing the CIGSSe slurry coating layer to undergo a primary sulfurization process and a primary selenization process by elevating temperature to form a primary CIGSSe absorption layer.

The thermal process device 160 may be a rapid thermal process device, it may include a rapid thermal crystallization section, a multi-stage crystallization section at a constant temperature, and a multi-stage cooling section (not shown) for sequentially carrying out a rapid thermal crystallization process, a multi-stage crystallization process at a constant temperature, and a multi-stage cooling process to the primary CIGSSe absorption layer. Therefore, the internal stresses can be mitigated or eliminated so that the crystal structure of the primary CIGSSe absorption layer can be improved.

The impurity cleaning device 170 may include an etching tank and a cleaning and drying device (not shown). The etching tank contains an etchant including at least one of sodium cyanide (NaCN), potassium cyanide (KCN), and bromide to remove impurity compounds including at least one of cuprous selenide and copper sulfide in the primary CIGSSe absorption layer. The cleaning and drying device is used for cleaning and drying the CIGSSe absorption layer so that the crystal quality of the CIGSSe absorption layer can be further improved.

The rear-stage selenization/sulfurization reaction device 180 is similar to the primary selenization/sulfurization reaction device 150, which includes a rear-stage sulfurization device and a rear-stage selenization device (not shown). By using the rear-stage sulfurization device and the rear-stage selenization device, a rear-stage sulfurization process and a rear-stage selenization process are respectively carried out to the primary CIGSSe absorption layer to form a rear-stage CIGSSe absorption layer, and then the required CIGSSe absorption layer is obtained.

The CdS buffer layer growth device 190 may include a CdS growth immersion device, a substrate scraping device, and a cleaning and drying device (not shown). The CdS growth immersion device contains an aqueous solution including sulfur and cadmium. When the rear-stage CIGSSe absorption layer is immersed in this aqueous solution, a CdS buffer layer is grown thereon. The substrate scraping device is used for scraping redundant materials on the edges and the back of the substrate. The cleaning and drying device is used for cleaning and drying the CdS buffer layer. The aqueous solution includes chloride, ammonia, and thiourea, and the chloride may include at least one of cadmium chloride, cadmium sulfate, cadmium iodide, and cadmium diacetate.

The feature of the system according to the present invention is that it can be operated under normal pressure and non-vacuum conditions to form a high quality CIGSSe absorption layer and CdS buffer layer used in CIGS solar cells.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A method for forming a copper indium gallium sulfur selenide (CIGSSe) absorption layer and a cadmium sulfide (CdS) buffer layer, by which the CIGSSe absorption layer and the CdS buffer layer are sequentially formed on a back electrode layer on a substrate under non-vacuum conditions, comprising the following steps:
   a mixing process, mixing a CIGSSe powder, a solvent, and an additive to form a CIGSSe slurry;
   a coating layer forming process, coating the CIGSSe slurry on the back electrode layer to form a CIGSSe slurry coating layer, the coating layer forming process including one of a spray coating process, a coating process, and an immersing process;
   a drying process, pre-drying and removing the solvent in the CIGSSe slurry coating layer;
   a densification process, including a rolling process, a high-pressure liquid spray pressing process, and a high-pressure gas spray pressing process, in which a pressure is applied onto the CIGSSe slurry coating layer to densify the CIGSSe slurry coating layer;

a primary selenization/sulfurization reaction process, comprising a primary sulfurization reaction and a primary selenization reaction by introducing hydrogen sulfide and hydrogen selenide, respectively, and making the CIGSSe slurry coating layer to produce sulfide and selenide by elevating temperature to form a primary CIGSSe absorption layer;

a thermal process, carrying out a crystallizing process of the primary CIGSSe absorption layer;

an impurity cleaning process, using an impurity scavenger to remove impurity compounds which are cuprous selenide and copper sulfide in the primary CIGSSe absorption layer, and carrying out cleaning and drying;

a rear-stage selenization/sulfurization reaction process, comprising a rear-stage sulfurization reaction and a rear-stage selenization reaction which allow the primary CIGSSe absorption layer to further form a rear-stage CIGSSe absorption layer, through the rear-stage sulfurization reaction and the rear-stage selenization reaction; and a CdS buffer layer growth process, immersing the CIGSSe absorption layer in an aqueous solution comprising sulfur (S) and cadmium (Cd) so as to form the CdS buffer layer on the CIGSSe absorption layer by a chemical bath deposition method.

2. The method as claimed in claim 1, wherein the CIGSSe powder comprises at least one of powders of copper-indium (CuIn) alloy, copper-indium-gallium (CuInGa) compound, copper-indium selenide (CuInSe), copper-indium-gallium selenide (CuInGaSe), copper-indium sulfide (CuInS), and copper-indium-gallium sulfide (CuInGaS).

3. The method as claimed in claim 1, wherein the solvent comprises at least one of alcohol and amine.

4. The method as claimed in claim 1, wherein the additive comprises at least one of dispersant, adhesive, and leveling agent.

5. The method as claimed in claim 1, wherein the thermal process is a rapid thermal process including at least one of a rapid thermal crystallization process, a multi-stage crystallization process at a constant temperature, and a multi-stage cooling process.

6. The method as claimed in claim 1, wherein the impurity compounds comprise at least one of cuprous selenide and copper sulfide.

7. The method as claimed in claim 1, wherein the impurity scavenger comprises at least one of sodium cyanide, potassium cyanide, and bromide.

8. The method as claimed in claim 1, wherein the aqueous solution comprises chloride, ammonia, and thiourea, and the chloride comprising at least one of cadmium chloride, cadmium sulfate, cadmium iodide, and cadmium diacetate.

9. The method as claimed in claim 1, wherein the CdS buffer layer growth process further comprises scraping edges and a back of the substrate to remove redundant materials.

* * * * *